United States Patent [19]

Sweeney

[11] Patent Number: 5,424,239
[45] Date of Patent: Jun. 13, 1995

[54] METHOD OF FABRICATING PRECISELY MATCHED POLYSILICON RESISTORS

[75] Inventor: Frank J. Sweeney, Rowlett, Tex.

[73] Assignee: Texas Instruments Incorporated, Dallas, Tex.

[21] Appl. No.: 189,852

[22] Filed: Feb. 1, 1994

[51] Int. Cl.⁶ .............................................. H01L 21/72
[52] U.S. Cl. ........................................ 437/60; 437/46; 437/918
[58] Field of Search .................... 437/46, 47, 60, 918; 148/DIG. 136

[56] References Cited

U.S. PATENT DOCUMENTS 4,602,421  7/1986  Lee et al. ............................. 437/46
5,196,233  3/1993  Chan et al. ........................... 437/46

FOREIGN PATENT DOCUMENTS 0521678  1/1993  European Pat. Off. ............ 437/918

OTHER PUBLICATIONS

Lane et al., "The Design of Thin-Film Polysilicon Resistors for Analog IC Applications", IEEE Trans. on Electron Devices, vol. 36, No. 4, pp. 738–744, Apr. 1989.

Primary Examiner—Brian E. Hearn
Assistant Examiner—Chandra Chaudhari
Attorney, Agent, or Firm—Douglas A. Sorensen; Richard L. Donaldson; William E. Hiller

[57] ABSTRACT

A method of fabricating a resistor which comprises the steps of providing a semiconductor substrate, preferably silicon, forming a layer of oxide over the substrate, providing on the layer of oxide a region of material having a substantially higher resistance in the undoped state than in the doped state, preferably polysilicon, patterning a region over the material to expose predetermined regions of the material, doping the exposed regions of the material to a predetermined doping level substantially greater than the doping level of the original material, masking the doped regions and a portion of the previously unexposed regions of the material on spaced apart portions of the doped regions and etching away the exposed region of material external to the doped regions and external to the portion of the previously unexposed regions of the material on spaced apart portions of the doped regions.

11 Claims, 1 Drawing Sheet

METHOD OF FABRICATING PRECISELY MATCHED POLYSILICON RESISTORS

BACKGROUND OF THE INVENTION

1. Field of the Invention

This invention relates to a method of fabricating matched polycrystalline silicon (polysilicon) resistors as well as a method of fabricating resistors which more closely provide a predetermined resistance value.

2. Brief Description of the Prior Art

Standard polysilicon processing techniques include the step of either doping the polysilicon during the step of polysilicon deposition or doping the already laid down polysilicon by a blanket dopant implant after the polysilicon deposition has taken place. In order to define the resistors to be fabricated in the polysilicon material of the above described type, a pattern for such resistors is laid down over the doped polysilicon in standard manner and the pattern is etched in standard manner, the resistance value of the fabricated resistor being determined by the dimensions of the etched doped polysilicon as well as by the doping level of the polysilicon. A technique of this type is described in "The Design of Thin-Film Polysilicon Resistors for Analog IC Applications", by William A. Lane and Gerald T. Wrixon, *IEEE Transactions on Electron Devices*, Vol. 36, No. 4, April 1989, pp. 738–744.

The above described procedure subjects the resistors being fabricated to dimensional errors caused by both the masking and the etching procedures and the variations therein due to undercutting and for other possible reasons since the etchant cannot be controlled to the degree desired. Such errors result in an inability to match resistors as closely as may be desired as well as the inability to fabricate a single polysilicon resistor which displays a resistance value as close as may be desired to a predetermined resistance value. It is therefore apparent that a procedure which will improve the above noted problems is desirable in the art. It should be noted that, while there may be other resistance value error-causing factors present in the polysilicon fabrication procedures, these other error-causing factors are not being addressed herein.

SUMMARY OF THE INVENTION

In accordance with the present invention, the above noted problems of the prior art are minimized and there is provided a fabrication process for polysilicon resistors which is capable of matching such resistors to a greater extent than is possible using prior art procedures and which is capable of more accurately fabricating single resistors to predetermined resistance values. Thus, higher performance can be obtained by the improved matching for applications such as gain setting, digital-to-analog conversion, attenuators, etc.

Briefly, the above is accomplished by allowing intrinsic or lightly doped polysilicon, herein described as undoped polysilicon, which provides a sheet resistance much higher than the targeted resistance of the resistor being fabricated, to act as an etch buffer for the polysilicon resistors being fabricated and to absorb the errors caused in the prior art processes due to etching, thereby permitting the doped, patterned polysilicon resistors to be fabricated unetched. This is accomplished by providing a silicon substrate, depositing or growing a layer of preferably electrically insulating material, preferably a field oxide, on the substrate and then depositing undoped polysilicon on the field oxide. Other electrically insulating materials that can be used in place of the field oxide include, but are not limited to, silicon nitride, silicon oxynitride, the silicon substrate itself, alumina, etc. Furthermore, under appropriate circumstances, no electrically insulating layer need be provided. The undoped polysilicon is then patterned and the portions whereat resistors are to be formed are implanted with dopant to the desired level. The mask is then removed and the polysilicon is again masked to cover the doped polysilicon regions and extend slightly over onto the undoped polysilicon region. The exposed polysilicon is then etched away to leave the unetched doped polysilicon resistors with the thin sidewall of undoped polysilicon therearound, the undoped polysilicon being of such high resistance relative to the doped polysilicon region so as to have negligible effect on the resistance values of the resistors.

While the description has been provided with reference to polysilicon which is an amorphous-crystalline material, the invention can also be used in conjunction with amorphous or crystalline materials as well.

DESCRIPTION OF THE PREFERRED EMBODIMENT

Figure 1A:
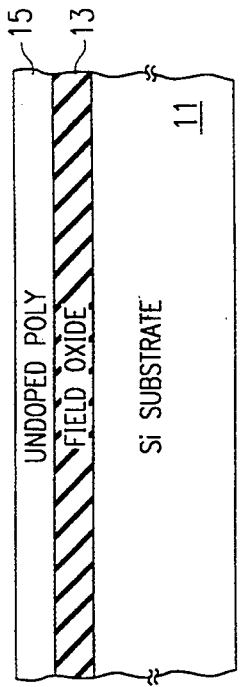
FIGS. 1a to 1c are a process flow for the fabrication of doped polysilicon resistors in accordance with the prior art.
Figure 1B:
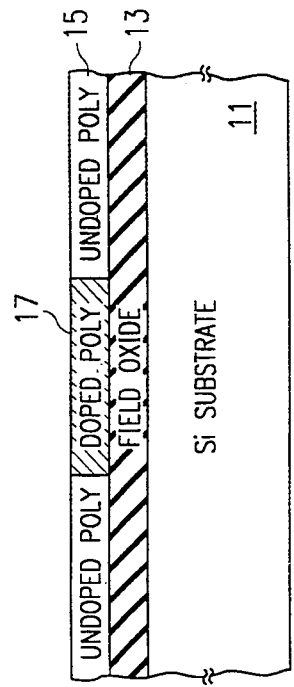
Figure 1C:
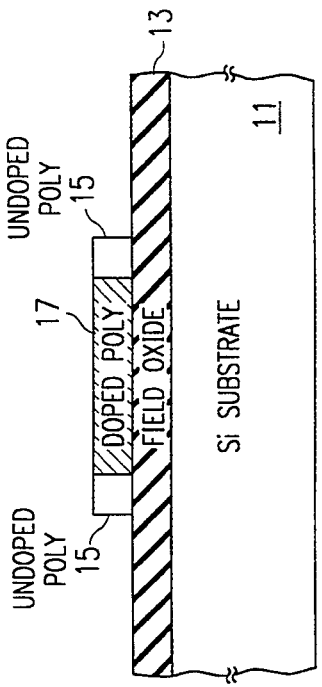

A prior art technique for fabrication of polysilicon resistors is shown with reference to FIGS. 1a to 1c. Referring first to FIG. 1a there is shown a silicon substrate 1 on which is grown a field oxide 3. Undoped polysilicon 5 is then deposited on the field oxide 3 by standard techniques, such as chemical vapor deposition (CVD), it being understood that doped polysilicon could be deposited instead with the doping step described hereinafter being eliminated or modified. Referring now to FIG. 1b, a blanket implant of dopant, preferably boron or phosphorous, is provided to dope the polysilicon layer 5 to the desired level, as will be required by the ultimate dimensions of the resistor being fabricated and the desired resistance value. The doped polysilicon layer 5 is then patterned by forming a patterned layer of resist thereover (not shown) and then etching the exposed polysilicon to leave the doped polysilicon resistor 7 as shown in FIG. 1c. The errors in the resistance of the resistor 7 arise because the etchant cannot be controlled sufficiently to avoid variations at the edges 9 of the resistor.

Figure 2A:
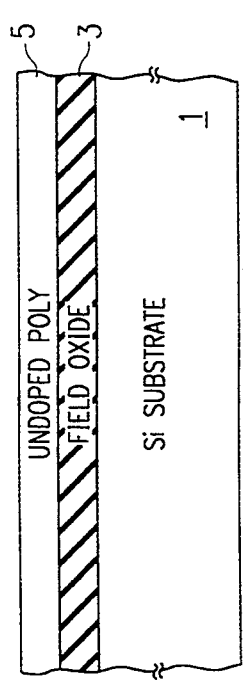
FIGS. 2a to 2c are a process flow for the fabrication of doped polysilicon resistors in accordance with the present invention.
Figure 2B:
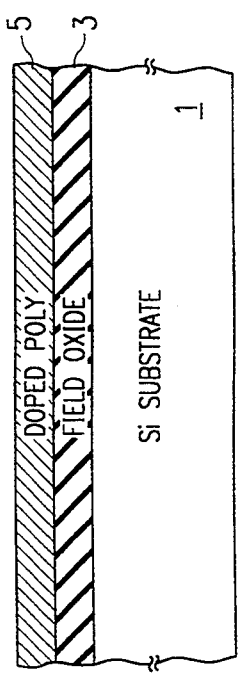
Figure 2C:
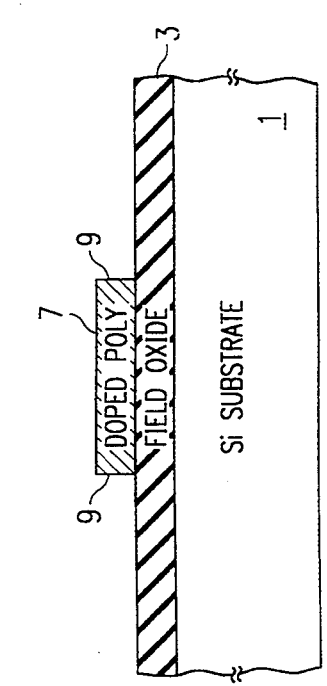

Referring now to FIGS. 2a to 2c, there is shown the process flow for fabrication of polysilicon resistors in accordance with the present invention. Referring to FIG. 2a, there is provided a silicon substrate 11 with a field oxide 13 which has been grown thereon as in the prior art. Next, a layer of undoped polysilicon 15 is deposited over the field oxide as in some of the above described prior art procedures. A pattern of resist or the like is then formed over the polysilicon layer 15 and the regions whereat the resistors are to be fabricated are doped, preferably with boron or phosphorous, to the desired level and then annealed in standard manner, as shown in FIG. 2b. As can be seen in FIG. 2b, the doped polysilicon 17 is surrounded by the undoped portion of the polysilicon layer 15. A pattern of resist (not shown) is then formed over the doped polysilicon 17 which extends onto the undoped polysilicon 15 and the exposed polysilicon is then etched away to leave the doped polysilicon region 17 which has not been etched to define the resistor with a thin side wall of undoped polysilicon 15 surrounding the doped region. The result is that the very high resistance undoped polysilicon region 15 is electrically in parallel with the relatively very low resistance doped polysilicon 17, whereby the undoped polysilicon 15 has negligible effect on the circuit resistance. Contacts (not shown) are then disposed at predetermined spaced apart locations of said doped polysilicon 17 to provide the resistor.

A demonstration is now shown of typical improvement provided by the present invention using undoped polysilicon with a thickness of 5000 Angstroms with grain size of 500 to 1000 Angstroms and polysilicon resistivity of about 1 Mohm-cm which results in a sheet resistance of $2 \times 10^{10}$ ohms/square. Typically, polysilicon is doped to a sheet resistance of a few hundred ohms to several thousand ohms/square. A value of 155 ohms/square is used for the present demonstration to obtain a low temperature coefficient of resistance. For polysilicon resistors implanted at a width of 30 micrometers, if a 32 micrometer wide window is used to etch the resistors (providing an overlap on the intrinsic polysilicon of 1 micrometer on all sides), then for a 30 micrometer long piece of polysilicon, there is one square of doped polysilicon (155 ohms) in parallel with 15 squares of intrinsic polysilicon ($3 \times 10^{11}$ ohms). With a variation due to etching of 0.03 micrometers per side, without the intrinsic polysilicon buffers or sidewalls absorbing the etch variation, a mismatch of 0.03 micrometers per side for 30 micrometer wide resistors results in an error of 0.2%. However, when the intrinsic polysilicon buffers are used, a mismatch of 0.03 micrometers per side for 2 micrometer wide 30 micrometer long intrinsic polysilicon in parallel with 30 micrometer wide 30 micrometer long 155 ohm/square doped polysilicon results in an error of $1.55 \times 10^{-9}$%, virtually eliminating any mismatch due to etch variations.

While the 1 micrometer per side overlap as used above is an arbitrary number chosen for the above example, the actual number necessary will be a function of process technology, etchant and dopant used. However, even at larger overlaps, the error is significantly reduced. For the above example, if there is a 5 micrometer overlap per side with an etch variation of 2.5 micrometers per side, the resulting error is $2.6 \times 10^{-7}$%.

The above described procedures can be used with any material which, like polysilicon, is very resistive when undoped and then becomes conductive when doped. Furthermore, even lightly doped polysilicon, where the sheet resistance is significantly greater than the targeted resistor sheet, can be used in place of intrinsic polysilicon.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. A method of fabricating a resistor comprising the steps of:

(a) providing a resistive layer of material having a substantially higher resistance in the undoped state than in the doped state;
(b) forming a first patterned mask over said resistive layer to expose regions of said resistive layer;
(c) doping the exposed regions of said material to a doping level substantially greater than the doping level of said resistive layer in step (a);
(d) forming a second patterned mask covering said regions, said second patterned mask extending beyond said regions such that none of the doped regions of said resistive layer are exposed;
(e) etching away the portion of said resistive layer not covered by said second patterned mask; and
(f) forming spaced conductive contacts on said doped regions of said resistive layer such that the resistance between said spaced conductive contacts is primarily determined by the resistivity of the doped regions of said resistive layer.

2. The method of claim 1 wherein said resistive layer is polysilicon.

3. The method of claim 1 further including, prior to step (a), the steps of providing a semiconductor substrate, forming a layer of oxide over said substrate, said resistive layer being then formed on said layer of oxide.

4. A method of fabricating a resistor comprising the steps of:

(a) providing a polycrystalline silicon layer;
(b) forming a first patterned mask over said polycrystalline silicon layer to expose regions of said polycrystalline silicon layer;
(c) doping the exposed regions of said polycrystalline silicon layer to a doping level substantially greater than the doping level of said polycrystalline silicon layer in step (a);
(d) forming a second patterned mask covering said regions, said second patterned mask extending beyond said regions such that none of the doped regions of said polycrystalline silicon layer are exposed;
(e) etching away the portion of said polycrystalline silicon layer not covered by said second patterned mask; and
(f) forming spaced conductive contacts on said doped regions of said polycrystalline silicon layer such that the resistance between said spaced conductive contacts is primarily determined by the resistivity of the doped regions of said polycrystalline silicon layer.

5. A method as in claim 4 wherein said second patterned mask extends beyond said regions by $5\mu$.

6. A method as in claim 4 wherein said second patterned mask extends beyond said regions by $1\mu$.

7. A method of fabricating a resistor comprising the steps of:

(a) providing a substrate;
(b) forming an insulating layer on said substrate;
(c) forming a polycrystalline silicon layer on said insulating layer;
(d) forming a first patterned mask over said polycrystalline silicon layer to expose regions of said polycrystalline silicon layer;
(e) doping the exposed regions of said polycrystalline silicon layer to a doping level substantially greater than the doping level of said polycrystalline silicon layer in step (c);
(f) forming a second patterned mask covering said regions, said second patterned mask extending beyond said regions such that none of the doped regions of said polycrystalline silicon layer are exposed;

(g) etching away the portion of said polycrystalline silicon layer not covered by said second patterned mask; and (h) forming spaced conductive contacts on said doped regions of said polycrystalline silicon layer such that the resistance between said spaced conductive contacts is primarily determined by the resistivity of the doped regions of said polycrystalline silicon layer.

8. A method as in claim 7 wherein said second patterned mask extends beyond said regions by $5\mu$.

9. A method as in claim 7 wherein said second patterned mask extends beyond said regions by $1\mu$.

10. A method as in claim 7 wherein said substrate comprises crystalline silicon.

11. A method as in claim 7 wherein said insulating layer comprises silicon dioxide.

* * * * *